United States Patent
Rodrigues (10) Patent No.: US 7,943,959 B2
(45) Date of Patent: *May 17, 2011

(54) LOW CAPACITANCE SEMICONDUCTOR DEVICE

(75) Inventor: Richard A Rodrigues, Reading (GB)

(73) Assignee: Littelfuse, Inc., Des Plaines, IL (US)

( * ) Notice: Subject to any disclaimer, the term of this patent is extended or adjusted under 35 U.S.C. 154(b) by 724 days.

This patent is subject to a terminal disclaimer.

(21) Appl. No.: 11/895,921

(22) Filed: Aug. 28, 2007

(65) Prior Publication Data

US 2009/0057717 A1   Mar. 5, 2009

(51) Int. Cl.
*H01L 23/62* (2006.01)

(52) U.S. Cl. .. 257/173; 257/579; 257/355; 257/E29.222

(58) Field of Classification Search ........ 257/173, 257/579, 355, E29.222
See application file for complete search history.

(56) References Cited

U.S. PATENT DOCUMENTS

| | | | |
|---|---|---|---|
| 3,553,536 A | 1/1971 | Neilson | |
| 3,994,012 A | 11/1976 | Warner, Jr. | |
| 4,167,804 A | 9/1979 | Greenstein | |
| 4,689,651 A | 8/1987 | Hanna et al. | |
| 4,860,083 A | 8/1989 | Kojo | |
| 5,001,537 A * | 3/1991 | Colman et al. | 257/173 |
| 5,189,588 A | 2/1993 | Yano et al. | |
| 5,476,811 A | 12/1995 | Fujii et al. | |
| 5,479,031 A | 12/1995 | Webb et al. | |
| 5,516,705 A * | 5/1996 | Webb et al. | 438/133 |
| 5,616,944 A | 4/1997 | Mizutani et al. | |
| 5,880,511 A | 3/1999 | Yu et al. | |
| 6,033,946 A | 3/2000 | Hutter et al. | |
| 6,259,134 B1 | 7/2001 | Amaratunga et al. | |
| 6,407,901 B1 * | 6/2002 | Casey et al. | 361/119 |
| 6,441,437 B1 * | 8/2002 | Gossner | 257/355 |
| 6,583,024 B1 | 6/2003 | Kononchuk et al. | |
| 6,781,161 B1 | 8/2004 | Turner et al. | |
| RE38,608 E | 10/2004 | Yu et al. | |
| 7,009,831 B2 | 3/2006 | Walters | |
| 7,026,705 B2 | 4/2006 | Yamamoto et al. | |
| 7,049,640 B2 | 5/2006 | Boisvert et al. | |
| 7,129,144 B2 * | 10/2006 | Tseng | 438/309 |
| 7,560,355 B2 * | 7/2009 | Kao et al. | 438/328 |
| 7,638,816 B2 * | 12/2009 | Rodrigues | 257/173 |
| 2002/0190324 A1 * | 12/2002 | Duane et al. | 257/355 |
| 2003/0071676 A1 | 4/2003 | Yamagishi et al. | |
| 2004/0070029 A1 | 4/2004 | Robb et al. | |
| 2004/0108516 A1 | 6/2004 | Kang | |
| 2004/0120085 A1 | 6/2004 | Yamamoto et al. | |
| 2005/0083618 A1 | 4/2005 | Steinhoff et al. | |

(Continued)

FOREIGN PATENT DOCUMENTS

| | | |
|---|---|---|
| GB | 2218872 | 11/1989 |
| WO | WO 2007/016266 | 2/2007 |
| WO | WO 2007016266 | 2/2007 |

*Primary Examiner* — Eugene Lee (74) *Attorney, Agent, or Firm* — Kacvinsky Daisak PLLC (57) ABSTRACT

A surge protection device with small-area buried regions (38, 60) to minimize the device capacitance. The doped regions (38, 60) are formed either in a semiconductor substrate (34), or in an epitaxial layer (82), and then an epitaxial layer (40, 84) is formed thereover to bury the doped regions (38, 60). The small features of the buried regions (38, 60) are maintained as such by minimizing high temperature and long duration processing of the chip. An emitter (42, 86) is formed in the epitaxial layer (40, 84).

8 Claims, 9 Drawing Sheets

U.S. PATENT DOCUMENTS

| | | |
|---|---|---|
| 2005/0152080 A1 | 7/2005 | Harris et al. |
| 2005/0230761 A1 | 10/2005 | Imahashi et al. |
| 2007/0120193 A1 | 5/2007 | Inoue |
| 2007/0272942 A1 | 11/2007 | Otake |
| 2008/0048215 A1 | 2/2008 | Davies |
| 2009/0008674 A1 | 1/2009 | Udrea |

* cited by examiner

LOW CAPACITANCE SEMICONDUCTOR DEVICE

TECHNICAL FIELD OF THE INVENTION

The present invention relates in general to semiconductor devices, and more particularly to semiconductor surge protection devices.

BACKGROUND OF THE INVENTION

Overvoltage protection devices, or surge protection devices, have been highly developed for protecting electrical equipment, especially semiconductor circuits, from damage due to dangerous voltage transients. Voltage transients occurring on conductors, such as communication lines, may be caused by lightning strikes, by electrostatic discharges, electromagnetic fields, etc. Overvoltage protection devices have typically included four layer semiconductor devices, namely thyristors. Ideally, an overvoltage protection device should respond very rapidly to suppress high speed transient voltages with very little overshoot, have a very high current-carrying capability, and exhibit very little capacitance.

One overvoltage protection device that has experienced widespread use is a two-terminal thyristor that employs four semiconductor layers and buried regions to facilitate and control turn on of the device in response to transient voltages. Such devices are known as Sidactor® overvoltage protection devices which are supplied by Littelfuse, Inc., Des Plaines, Ill., under the brand name of Teccor®. The incorporation of buried regions into an overvoltage protection device is disclosed in U.S. Pat. No. 5,479,031 by Webb et al; U.S. Pat. No. 6,084,253 by Turner, Jr.; U.S. Pat. No. 6,531,717 by Casey, et al; and U.S. Pat. No. 6,956,248 by Casey et al.

The buried regions in a thyristor device determine, or at least significantly affect, many operating parameters of the device. The number and placement of the buried regions affect the turn on response of the device. The impurity concentration of the buried regions determine the breakover voltage of the thyristor device, i.e., the voltage at which the device enters a low impedance negative resistance region. The higher the impurity concentration in the buried regions, the lower the breakover voltage of the device. Typically, the buried regions are formed by depositing a high concentration of a dopant on the surface of the wafer for a long period of time, such as 30 hours, and then driving the dopant into the wafer for another 30 hours. A high temperature and long term schedule is required to drive the dopants deeply into the wafer. Once the buried regions are formed, a base region is formed thereover, and the emitter or cathode region is formed in the base region, again at standard elevated semiconductor processing temperatures.

Figure 1:
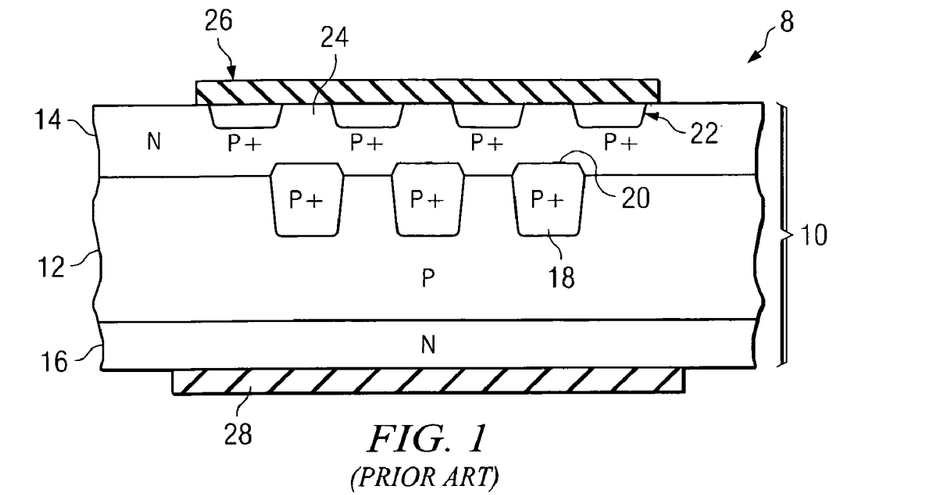
FIG. 1 is a cross-sectional view of a semiconductor chip constructed according to the prior art.

FIG. 1 illustrates the detailed construction of a unidirectional surge protection device 8 fabricated according to prior art techniques. The device 8 is formed in the top surface of a P-type silicon substrate 10, which is shown between metal contacts 26 and 28. Semiconductor region 12 is in the middle of the semiconductor substrate 10 and defines both the mid-region of the four layer thyristor, and the base of a PNP transistor. A first N-type base region 14 is formed in the top surface of the substrate 10, and a second N-type anode region 16 is formed in the bottom surface of the substrate 10. However, plural heavily doped buried regions 18 are formed in the mid-region 12, by standard semiconductor diffusion techniques, before either base region 14 or 16 is formed. The buried regions 18 are formed by depositing boron ions for about three days, resulting in a saturation concentration of about $10^{19}$ atoms per $cm^3$ on the surface of the substrate 10, and a depth of about 80 microns. This impurity concentration is effective to provide a breakover voltage in the range of about 8-12 volts. The wafer undergoes a diffusion process at a temperature of about 1275° C. for about three days to activate the boron ions. After activation of the boron ions, both sides of the semiconductor substrate 10 are subjected to another diffusion process in which the N-type base region 14 and the anode region 16 are formed. The concentration of the N-type impurity must be sufficient to compensate the P-type boron in the buried regions 18. As a result, junctions 20 are formed between the base region 14 and the buried regions 18. It is this junction 20 that determines the breakover voltage of the device. The avalanche breakdown of the junction provides a negative resistance characteristic to the device. A P-type emitter 22, with holes therein defining shorting dots 24, is formed in the base region 14. The shorting dots 24 in the emitter 22 can be formed over the buried regions 18 as disclosed in U.S. Pat. No. 5,479,031. Alternatively, the buried regions 18 can be fully offset from the emitter edges as disclosed in U.S. Pat. No. 6,531,717. A metal emitter contact 26 is formed in electrical contact with both the shorting dots 24 of the base region 14 and the emitter 22. An anode metal contact 28 is formed on the bottom of the chip in electrical contact with the anode region 16.

While the foregoing is time consuming, and thus expensive, it represents the conventionally accepted method of fabricating two-terminal thyristors, of the Sidactor overvoltage protection device type. One disadvantage of the foregoing method of forming buried regions is that such regions cannot generally be made with a small area, and thus with a small capacitance, as the high temperature processing steps cause the impurities to diffuse outwardly in all directions in the wafer. Thus, the deeper the buried regions are formed, the larger they grow as a function of time and temperature. As the chip undergoes high temperature processing, the impurities in the buried regions diffuse outwardly, thus reducing the concentration of the impurity. The reduction in the impurity concentration of the buried regions correspondingly increases the breakover voltage of the device. Tight control over the breakover voltage is thus difficult to achieve. When the buried regions form large-area junctions with the base region of the chip, the capacitance of such device is correspondingly large. Large, capacitance thyristors may be suitable for some applications, but not in high speed data transmission applications, such as in DSL, VDSL or with other high speed communication line transmission protocols.

An additional concern is that if low voltage overvoltage protection devices are required, such as for digital transmission lines, then the buried regions must have high concentration impurity levels to lower the reverse breakdown voltage of the junctions associated with the buried regions. Again, it becomes more difficult to achieve high concentration levels in the regions deeply buried in the semiconductor chip, as there is a limit as to the concentration of the dopant deposited on the surface of the chip. In many instances, the concentration of the impurities deposited on the surface of the semiconductor substrate to form the buried regions is at a saturation level, for low voltage operation. Then, as the long diffusion process is carried out to move the dopants deeply into the semiconductor chip, the concentration of the dopant becomes less as a function of distance from the surface of the chip. Accordingly, it is difficult and costly to fabricate overvoltage protection devices that have low breakover voltages useful in protecting digital and other low voltage lines.

From the foregoing, it can be seen that a need exists for a process and corresponding product that allows deep buried regions to be formed so that low capacitance, low voltage surge protector devices can be efficiently fabricated. A need also exists for a low capacitance surge protection device for use with high speed communication lines so that the high speed signals are not adversely affected. An additional need exists for a method of forming buried regions in a surge protection device so that a high degree of control can be achieved over the breakover voltage of the device.

SUMMARY OF THE INVENTION

In accordance with the principles and concepts of the invention, there are disclosed surge protection devices exhibiting low capacitance and low breakover voltage characteristics. These and other advantages are achieved by forming plural small-area, shallow buried regions in the surface of a semiconductor substrate, where a high concentration of the dopant in the buried regions produces a low breakover voltage. The buried regions are then covered with a layer of epitaxial semiconductor material. An emitter region is formed in the top surface of the epitaxial layer in a convention manner. The formation of an epitaxial layer of semiconductor material over the buried regions, and the subsequent processing steps of the substrate, reduces the diffusion of the buried regions, thus keeping the area small and the resulting capacitance of the device. The impurity concentration in the buried regions also remains localized, and is not substantially reduced by long term diffusion processes. A lower breakover voltage is thus realized with low capacitance.

In accordance with another feature of the invention, the buried regions are formed with a P-type region and an N-type region, thus forming a PN junction within the buried region.

In accordance with another aspect of the invention, the area of the PN junction is maintained small, thus minimizing the junction capacitance.

In accordance with yet another feature of the invention, a plurality of buried regions can be used to increase the current capacity of the surge protection device, while minimizing the capacitance, as compared to prior art techniques.

According to one embodiment of the invention, disclosed is a surge protection device of the type having four semiconductor layers, one or more buried regions and at least two terminals, where conduction occurs from one face of the chip to an opposite face of the chip when a voltage exceeding a breakover voltage is applied to the device. The buried regions are formed in a surface of a semiconductor layer of the device, and an impurity concentration of the buried regions defines, in part, the breakover voltage of the device. Further included is an epitaxial layer of semiconductor material formed over the semiconductor layer so as to cover the buried regions, whereby a processing of the epitaxial layer does not substantially change a size of the buried regions, thus controlling the capacitance of the device.

According to another embodiment of the invention, disclosed is a method of fabricating a four-layer surge protection device, which includes the steps of depositing an impurity at selected locations in an exposed surface of a semiconductor layer of the surge protection device, where a concentration of the impurity defines, in part, a breakover voltage of the surge protection device, and the selected locations of the impurity define buried regions. Further steps include forming an epitaxial layer of semiconductor material over the buried regions, and forming a base semiconductor layer over the epitaxial semiconductor layer to thereby define a PN junction therebetween. An emitter region is then formed in the base semiconductor region.

According to yet another embodiment of the invention, disclosed is a method of fabricating a four-layer surge protection chip, including the steps of forming a PN region in a first semiconductor layer during fabrication of the surge protection chip so that the PN region has a PN junction therein. Further steps include forming the PN junction with an impurity concentration to provide a desired breakover voltage to the surge protection chip, and forming a second layer of semiconductor material over the PN region to thereby bury the PN region. An emitter region is formed in the second semiconductor material, and respective contacts are formed on opposing faces of the surge protection chip.

According to yet another embodiment of the invention, disclosed is a surge protection device which includes a substrate, and a layer of substantially intrinsic semiconductor material formed over the substrate. One or more buried regions are formed in the intrinsic semiconductor material, and a semiconductor base region is formed on the intrinsic semiconductor material. An emitter is formed in the base region. As a result, when a junction between the semiconductor base layer and the intrinsic semiconductor is reverse biased, a depletion region in the intrinsic semiconductor material is wider than a depletion region is the semiconductor base region, thereby reducing the capacitance of the surge protection device.

With regard to another embodiment of the invention, disclosed is a surge protection device which includes a substrate for supporting the surge protection device, and a doped epitaxial semiconductor barrier layer formed on the substrate. An intrinsic epitaxial layer is formed on the barrier layer, and one or more buried regions are formed in the intrinsic epitaxial layer. A doped epitaxial base region is formed on the intrinsic epitaxial layer, and an emitter is formed in the base region. A number of shorting dots are formed in the emitter, where the shorting dots each comprise a portion of the base region. An emitter contact is in contact with both the emitter and the shorting dots. An anode contact is formed on the substrate.

Disclosed in connection with another embodiment of the invention is a method of making a surge protection device. The steps include forming one or more regions that are buried in an intrinsic epitaxial layer of semiconductor material. The impurity concentration of the buried regions defines a breakover voltage of the surge protection device. A semiconductor base layer is formed over the intrinsic epitaxial semiconductor material so that a junction is formed therebetween. When the junction is reverse biased, a depletion region formed in the intrinsic epitaxial semiconductor material is wider than a depletion region formed in the base layer, whereby a capacitance of the surge protection device is reduced. An emitter is formed in the base layer.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same regions, functions or elements throughout the views, and in which.

DETAILED DESCRIPTION OF THE INVENTION

Figure 2:
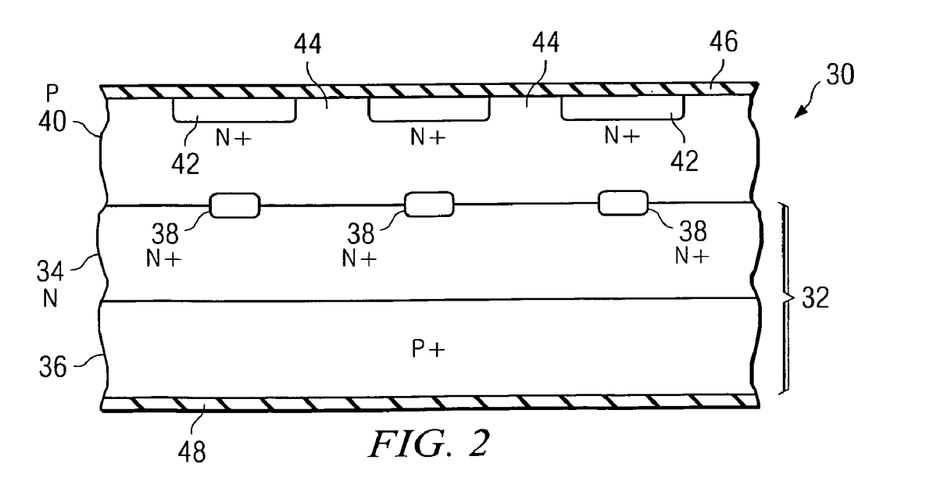
FIG. 2 is a cross-sectional view of a surge protection device according to one embodiment of the invention.

With reference to FIG. 2, there is illustrated a surge protection device 30 constructed according to one embodiment of the invention. The surge protection devices disclosed herein are four-layer devices that exhibit negative resistance characteristics when full conduction is entered. A starting substrate 32 of a lightly doped N-type impurity is selected. The lightly doped N-type impurity provides a mid-region 34 for the four-layer thyristor 30. The lightly doped mid-region 34 minimizes the capacitance of the chip, it being understood that the depletion region of lightly doped junctions is wide, thus exhibiting a low capacitance as compared to junctions formed between heavily doped regions. The backside of the substrate is then processed to diffuse a P-type impurity therein to form a heavily doped P+ anode region 36.

Next, the wafer is masked with a silicon oxide or nitride mask to define openings for the formation of the buried regions 38. The openings in the mask can be of any shape. With round openings, the diameter can be from about 10 microns to about 100 microns. However, openings of other sizes can be used to optimize desired electrical characteristics. For example, small size openings in which the buried regions are formed minimize capacitance, but may compromise the surge current carrying capability of the device. Large size openings may optimize the surge current carrying capability, but may also increase the capacitance of the device. Preferably, the openings in which the buried regions are formed should not have sharp edges or corners. The buried regions 38 are formed in the top surface of the mid-region 34 by diffusing or implanting an N-type impurity, such as arsenic or phosphorus. The dosage of the N-type impurity is heavy to form the heavily doped buried regions 38 and thus achieve a low breakover voltage. A dosage of about $10^{18}$ atoms/cm$^3$ is believed to establish a breakover voltage of about 5.5 volts. The depth of each buried region 38 formed in the mid-region 38 is preferably shallow. According to an important feature of the invention, the features of the buried regions are maintained small to thereby minimize the capacitance of the device. Buried regions fabricated according to the teaching hereof are believed to result in a surge protection device exhibiting capacitances of about 10 pf, or less, with small die sizes. The capacitance of the buried regions 38 is in the width of the depletion region of the junction between the N+ material of the buried region 38 and the P-type material of the overlying epitaxial layer 40, to be described below. In order to achieve a large surge current capability for the thyristor device 30, a large number of buried regions can be formed. A long term drive of the N-type impurities into the chip is not required, as the regions 38 are buried by the use of semiconductor region 40 formed over the buried regions 38. Once the buried regions 38 are formed in the surface of the mid-region 34, the mask is removed.

In accordance with an important feature of the invention, the regions 38 are buried by depositing a layer 40 of P-type epitaxial material over the surface of the mid-region 34. This effectively buries the N+ regions 38 so that an emitter 42 can be formed thereover. Conventional epitaxial processing steps and equipment can be employed to form the epitaxial layer 40. As is conventionally known, epitaxial reactors can be controlled to introduce the selected impurity at a desired concentration, and grown to a specified thickness. The thickness of the epitaxial layer 40 can be selected to emphasize various electrical parameters. For example, the epitaxial layer 40 can be made thin to increase the speed of the device, as the transition time of carriers therethrough is made shorter. A thickness of the epitaxial layer can be about 50 microns, or other desired thicknesses. It is important to realize that the formation of an epitaxial layer 40 is carried out under temperatures somewhat less than that required for diffusion processes, and in much less time, thus minimizing the enlargement of the buried regions 38 and changes in the impurity concentration thereof. In addition, much less time is involved in growing epitaxial layers than forming similar semiconductor regions by diffusion techniques. By employing epitaxial methods, better control over the desired breakover voltage can also be achieved. The epitaxial layer 40 forms a base region for an NPN transistor of the four layer device.

The semiconductor junction formed between the epitaxial layer 40 and the underlying mid-region 34, including the buried regions 38, is characterized as an abrupt junction. This is primarily the result of the junction being formed at the interface of the epitaxial layer 40, rather than being formed by diffusion techniques. An abrupt junction is formed when the dopant profile changes abruptly at the junction. The semiconductor material of the epitaxial layer 40 thus forms an abrupt gradient PN junction with the underlying mid-region 34. The use of an abrupt junction allows the surge protection device to be made with a lower breakover voltage.

The wafer is further processed by masking the same to form an emitter 42 or cathode region in the top of the epitaxial layer 40. While the cross section of the surge protection device 30 shown in FIG. 2 appears to have emitter islands, in practice the emitter is a single layer of heavily doped N-type material with openings therein to define shorting dots 44. The shorting dots 44 are effectively portions of the epitaxial base layer 40 that extend through the openings in the emitter 42. The shorting dots 44 function to define the turn on and turn off current of the device. As can be appreciated, initial current that passes from the base region 40 through the shorting dots 44 to the emitter contact 46 is lost and does not assist in producing the required 0.7 volt threshold for the base emitter junction for turn on of the device. The number, shape and location of the shorting dots can be determined experimentally to set the turn on current of the surge protection device 30.

After processing of the wafer to form the emitter region 42, the wafer is further processed to form metal contacts thereon. An emitter contact 46 is formed over the top surface of the chip to short circuit the epitaxial base region 40, via the shorting dots 44, to the emitter region 42. A bottom metal anode contact 48 is formed over the bottom of the chip to thus form a two-terminal, four-layer surge protection device 30. While the surge protection device of FIG. 2 is described starting with a N-type substrate 32, a P-type starting substrate could be used, together with a change in the impurities of the other semiconductor regions.

Figure 3:
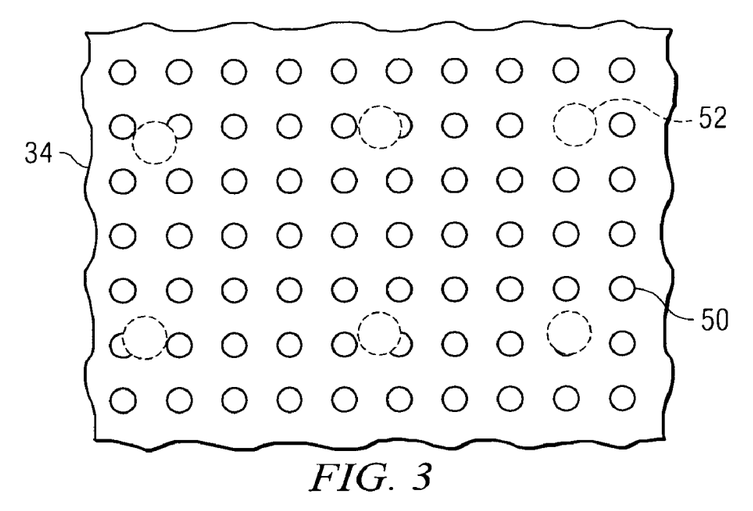
FIG. 3 is a top view of the buried region islands, with the emitter shorting dots shown in broken lines.

FIG. 3 illustrates one possible pattern of buried regions 50 formed in the mid-region 34 in the manner described above. As can be appreciated, the buried regions 50 can be formed using a mask with many individual openings therein to form the individual buried regions 50. It should also be appreciated that by using small area buried regions 50, the capacitance of the device is minimized. Even when the number of small buried regions 50 is increased to increase the surge current capability of the device, the total area may yet be less than conventional large-area buried regions. Thus, a reduction in capacitance is yet achieved while not compromising the low capacitance of the device. The buried regions 50 need not be equally spaced from each other as shown in FIG. 3, but may be laid out to have higher densities in some areas of the chip, and lower densities in other areas of the chip. In addition, some of the buried regions may be larger in area than others, based on the location thereof on the chip. The cross-sectional shape of the buried regions need not be round as shown, but can be many other geometrical shapes, including circular or partial circular lines formed around the shorting dots 52. Many of the foregoing, and other alternatives, and combinations thereof may be employed by those skilled in the art to achieve special effects or results, based on the geometry and spacing of the shorting dots 52 formed in the emitter 42, as well as other considerations.

Figure 4:
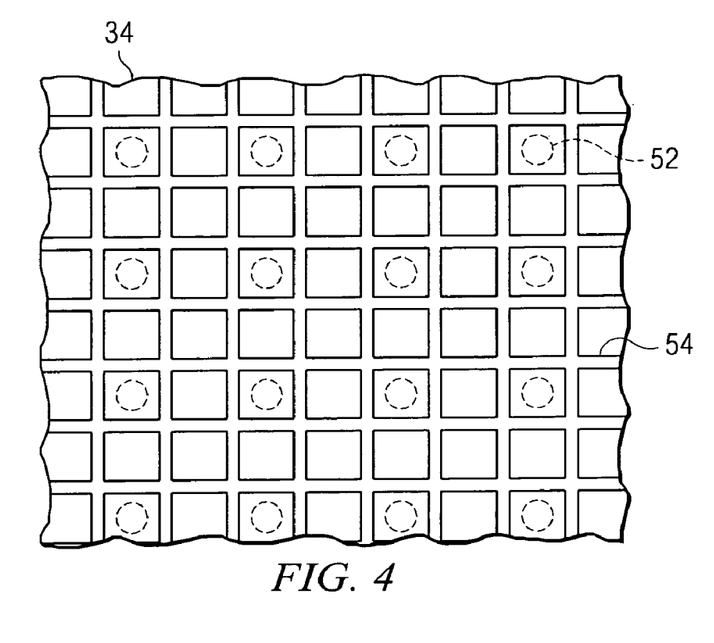
FIG. 4 is a top view of a lattice-shaped buried region, with the emitter shorting dots shown in broken lines.

FIG. 4 illustrates a lattice-type buried region 54 formed in the mid-region of the chip. The lattice-shaped buried region 54 can be a matrix of lines along an x-axis and a y-axis, or diagonal lines. The line width of the matrix-shaped buried region may be limited to the photolithography techniques employed. In addition, the buried region can comprise only parallel lines or stripes running in any direction, or broken lines, or any variation thereof.

Figure 5:
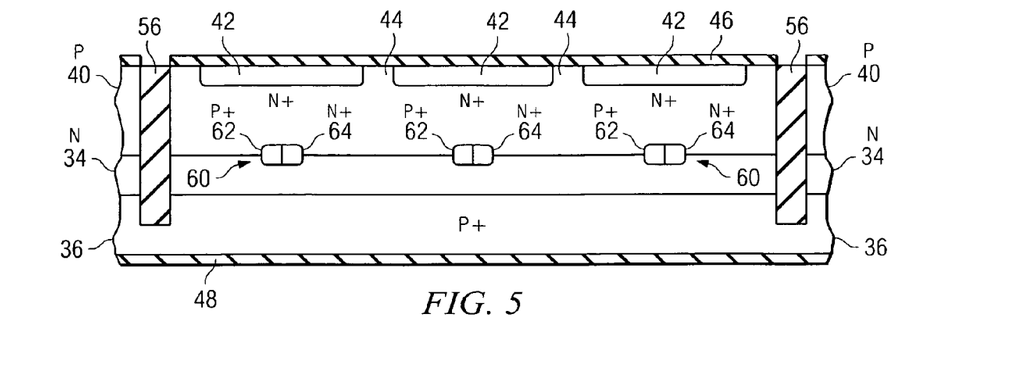
FIG. 5 is cross-sectional view of a surge protection device according to a second embodiment of the invention, in which epitaxial layers are used, as well as PN buried regions.
Figure 6:
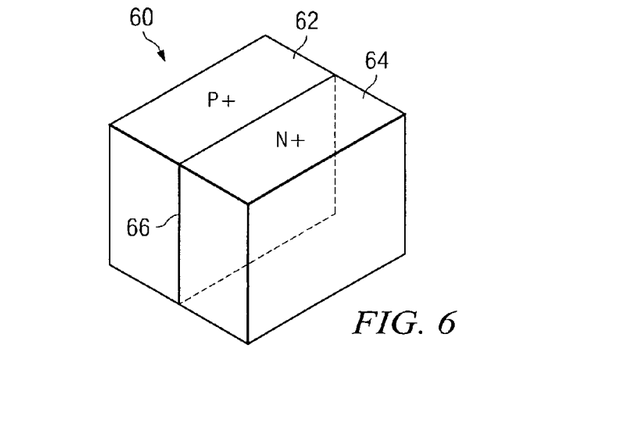
FIG. 6 is an isometric and enlarged view of a PN buried regions, showing the PN junction therebetween.

FIG. 5 depicts another embodiment of a surge protection device of the invention. Here, the device includes many of the layers described in connection with the embodiment shown in FIG. 2, but additionally includes a two-part buried region 60. The buried region 60 includes a P+ area 62 adjacent to an N+ area 64, forming a PN junction 66 therebetween, as shown in the enlargement of FIG. 6. As noted above, the buried regions are preferably formed with small-area features to minimize the capacitance thereof. In the PN junction type of buried region 60, the heavily doped P+ area 62 and the heavily doped N+ area 64 are both small, and thus the PN junction 66 is also small. This is in keeping with the invention, as the heavily doped buried region 60 is characterized by a thin, small-area depletion region. As described above, the heavy doping of the buried regions 60 is necessary to provide a low breakover voltage for the device. It is noted that the width of the depletion region of a PN junction is similar to the gap between the plates of a discrete capacitor. When the area of the junction 66 is maintained small, the capacitance of the buried region is also minimized. Those skilled in the art will appreciate that the two masks can be employed to form the different areas 62 and 64 of the buried region 60. While the two-part buried region 60 shown in FIG. 6 is generally square, it can be made without sharp edges by using circular mask openings that overlap in the middle. With this arrangement, a top view of the resulting buried region would be hour-glass shaped, or similar thereto depending on the extent of overlap of the mask openings. Alternatively, single-dopant buried regions, such as shown in FIG. 2, can be used with the embodiment of FIG. 5, without using the two-part buried regions.

A trench is etched in the top of the wafer between the individual chips. The trench is etched down into the P+ substrate 36. The trench is then filled with an oxide, such as a glass isolation/passivation material, as shown by reference character 56.

Figure 7A:
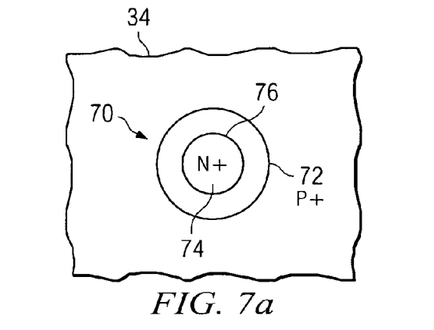
FIGS. 7a and 7b are respective top and cross-sectional views of another PN type of buried region which employs one mask operation.
Figure 7B:
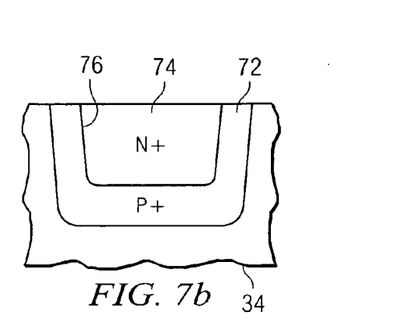

While the buried region 60 of FIG. 6 is illustrated as one semiconductor area 62 adjacent to another semiconductor area 64 so as to form a planar junction 66, such an architecture is not a necessity. The surge protection device can be fabricated using buried regions 70, as shown by the top view in FIG. 7a and the side view of FIG. 7b. Here, the buried region 70 is constructed by first diffusing or implanting a P+ impurity in an opening of a mask formed on the semiconductor material of the mid-region 34. Using the same mask, an N+ impurity is then be diffused or implanted in the same mask opening. During the further processing of the chip, the P+ impurity will diffuse outwardly somewhat more than the N+ impurity, leaving some P+ impurity material generally outside the N+ core. It is noted that a high concentration of the N+ impurity is required to compensate or overcome the P+ impurity in the center of the buried region 70. In any event, a PN junction 76 is formed between the P+ material 72 and the N+ material 74 of the buried region 70. This architecture of a buried region affords a high surge current capability. While the buried region 70 is shown to be circular, as viewed from the top, the buried region 70 can be formed with other shapes as a function of the shape of the opening in the mask.

Figure 8:
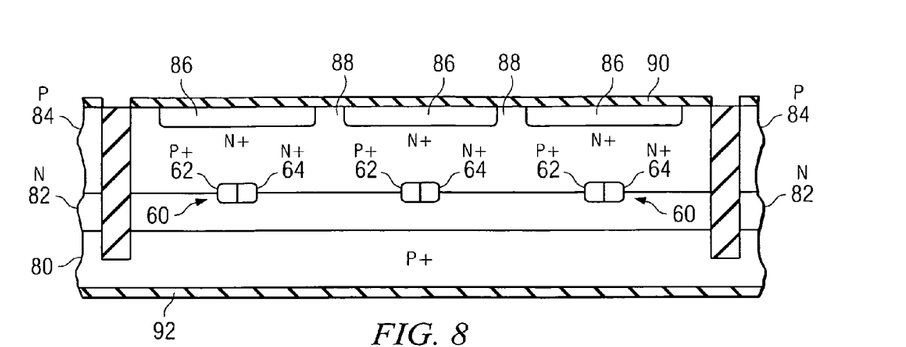
FIG. 8 is a cross-sectional view of an embodiment of a surge protection device employing two epitaxial layers.

According to another embodiment of the invention shown in FIG. 8, there is disclosed a surge protection device employing two epitaxial layers. The surge protection device of FIG. 8 is fabricated by using a starting P+ silicon substrate 80, with a thickness in the range of about 200-500 microns. An N-type epitaxial layer 82 is then deposited on the surface of the substrate 80. The use of an epitaxial layer 82 on the P+ substrate 80 provides a great degree of flexibility in controlling the thickness of the layer 82 which functions as a mid-region. The N-type epitaxial layer 82 can be made thin to control the power dissipation of the device and increase the speed of operation thereof. Typically, the epitaxial layer 82 can be about 20-40 microns thick, although other thicknesses can be employed. In applications where the voltage of operation of the circuits to be protected is low, such as in DSL, VDSL and other digital communication lines, the epitaxial layer 82 can be made thin, down to about 5-10 microns.

Next, the exposed surface of the bottom (or first) epitaxial layer 82 is masked to form the buried regions 60 therein. The buried regions 60 comprising heavily doped P+ regions 62 and heavily doped N+ regions 64 can be formed in the same manner described above. Again, the buried regions 60 can be formed with very small features to minimize the capacitance of the device, and include small-area PN junctions.

Once the buried regions 60 are formed in the bottom N-type epitaxial layer 82, the chip undergoes another epitaxial process in which a second (or top) epitaxial layer 84 is deposited on the first epitaxial layer 82. The second epitaxial layer 84 is a P-type layer forming a base layer for an NPN transistor of the four-layer surge protection device. The second epitaxial layer can be grown to a depth of about 50 microns.

An emitter or cathode region 86 is then formed in the second epitaxial layer 84. The emitter region 86 may be formed with a desired number and pattern of shorting dots 88 to control the switching current ($I_s$) and holding current ($I_h$) of the device. The various chips on a wafer are isolated with glass-filled trenches, much like the embodiment described in connection with FIG. 5. An emitter contact 90 and an anode contact 92 are formed on opposing sides of the chip to provide electrical contact thereto by a lead frame or wire terminals.

Figure 9:
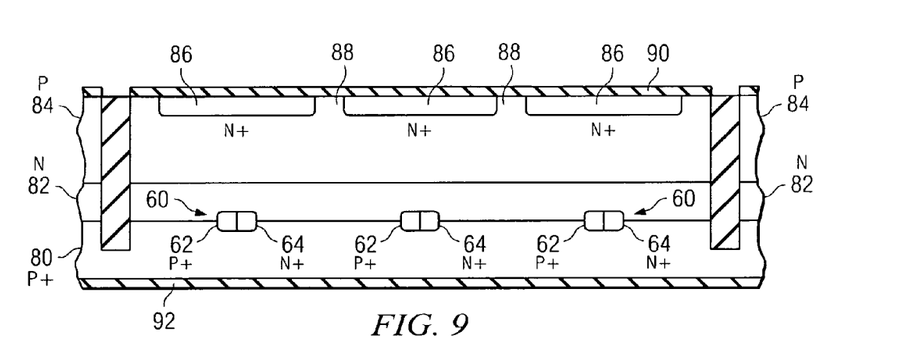
FIG. 9 is a cross-sectional view of another embodiment of a surge protection device in which the buried regions are formed in the substrate, with two epitaxial semiconductor layers overlying the buried regions.

The embodiment shown in FIG. 9 is much like that shown in FIG. 8, but the buried regions 60 are formed in the semiconductor substrate 80, rather than in the first epitaxial layer. Here, the P+ semiconductor substrate 80 is processed to form the buried regions 60 therein. A first epitaxial layer 82 of an N-type is deposited over the substrate 80, thus burying the buried regions 60. A second epitaxial layer 84 is then deposited over the first epitaxial layer 82. The thickness and impurity concentration of the second epitaxial layer, which forms a base layer for the device, can be controlled to achieve desired electrical characteristics for the device. In such a device, the holding current ($I_H$) can be made independent of the breakover voltage. The emitter region 86, shorting dots 88 and the metal contacts 90 and 92 are formed in a manner similar to that described above in connection with FIG. 8.

Figure 10:
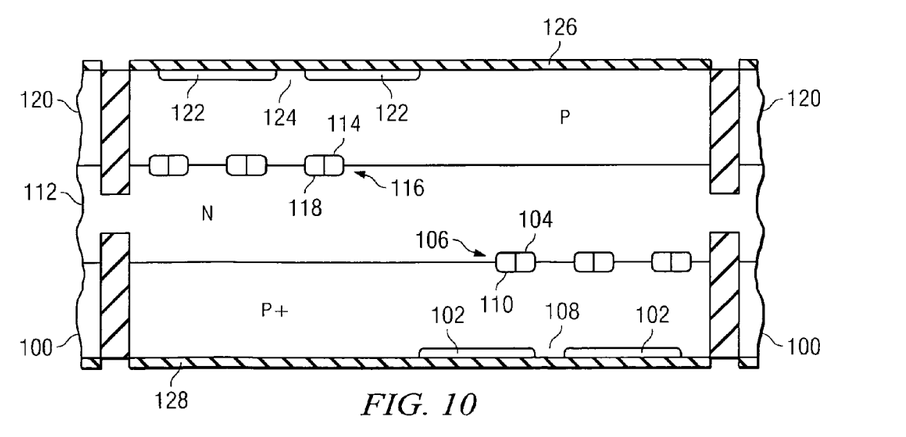
FIG. 10 is a cross-sectional view of another embodiment of a surge protection device in which bidirectional operation is achieved.

FIG. 10 illustrates a bidirectional surge protection device constructed according to an embodiment of the invention. A starting P+ substrate 100 is employed for the bidirectional device. The P+ substrate 100 is processed by masking the same to form openings for the N+ area 104 of each buried region 106. The wafer is then subjected to a process in which an N-type impurity is deposited in the openings of the buried region mask at a very high concentration to form the respective N+ areas 104 of the buried regions 106. Next, the top mask is removed and replaced with another mask to form the P+ area 110 of the buried regions 106. The wafer is subjected to the deposition or implant of a P-type impurity to form the heavily doped P+ areas 110 of the buried regions 106. Mask alignment is important so that the N+ area 104 forms a junction with the P+ area 110. The buried regions 106 are associated with a first unidirectional surge protection device of the chip.

Once the buried regions 106 have been formed in the substrate 100, a first epitaxial layer 112 is deposited on the substrate 100, over the buried regions 106, thus forming a mid-region for the chip. The epitaxial layer 112 is deposited using an N-type impurity, and is deposited to a desired thickness to control the various electrical parameters of the bidirectional surge protection device. The surface of the first epitaxial layer 112 is masked to form the N+ area 114 of each buried region 116. The N+ area 114 of each buried region 116 is heavily doped using an N-type impurity. The wafer is then processed to remove the mask used in making the N+ areas 114 of the buried regions 116, and again masked to form the P+ areas 118 of the buried regions 116. A P-type impurity is diffused or implanted into the mask openings to form the P+ area 118 of each buried region 116. The buried regions 116 are associated with a second unidirectional surge protection device of the chip. The fabrication of both unidirectional surge protection devices in the same chip results in bidirectional operation.

The buried regions 116 of the other device are then covered with a second epitaxial layer 120. A P-type impurity is used in the second epitaxial process to form the P-type base region 120. The wafer is then masked on both sides thereof to define areas for forming therein the N+ emitter regions 102 and 122 for both unidirectional surge protection devices. An N-type impurity is diffused or implanted into the openings of the emitter masks to form the emitter region 102 of the device on the bottom portion of the chip, and to form the emitter region 122 of the device formed in the top of the chip. Respective shorting dots 108 and 124 can also be formed in the emitter regions 102 and 122. While it is noted that FIG. 10 is described in terms of a device in the top and bottom portions of the chip, each unidirectional device uses each of the semiconductor layers during conduction to carry current from one contact 126 to the other contact 128, depending on the polarity of voltage across the chip. Also, the various semiconductor regions can be fabricated with semiconductor layers adapted for providing symmetrical electrical operation for transient voltages of both polarities. Alternatively, the various semiconductor regions, and especially the buried regions, can be fabricated with different impurity concentrations to provide asymmetrical electrical operation. Also, the various semiconductor regions can be fabricated to achieve different holding currents, different switching and latching currents, etc., for transient voltages of opposite polarities.

Lastly, metal contacts 126 and 128 are formed on the opposite faces of the chip to provide a connection for a lead frame or wire terminals to the chip. In other instances, the metal contacts 126 and 128 may serve as the contacts for wave soldering the chips to printed circuit boards or the like.

Figure 11:
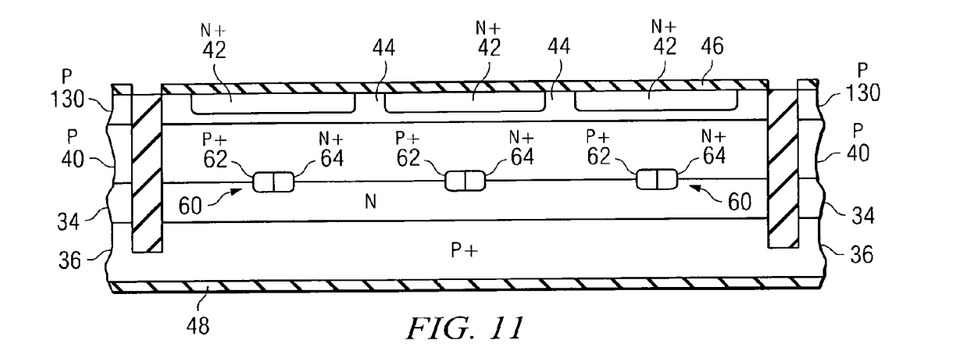
FIG. 11 is a cross-sectional view of another embodiment of a surge protection device of the invention, with an additional layer of semiconductor material in which the emitter is formed to achieve desired electrical characteristics.

FIG. 11 illustrates a variation of the surge protection device shown in FIG. 5. The semiconductor layer in which the emitter region 42 is formed is modified with an impurity and concentration to achieve the desired electrical characteristics of the device. Rather than forming the emitter region 42 directly in the epitaxial layer 40, another semiconductor region or layer 130 is formed. This feature may be characterized as a chip with a first base region 40 and a second base region 130 associated with the same emitter 42. The semiconductor layer 130 is formed either by diffusion of a P-type impurity into the top epitaxial layer 40, or by depositing an additional P-type epitaxial layer 130 on the epitaxial layer 40. As an alternative, the second layer 130 can be formed during the same epitaxial process as is used to form the first epitaxial layer 40, but at the latter stage of the epitaxial process the concentration of the P-type impurity is changed to achieve a different concentration in the second layer 130 as compared to the first layer 40.

The effective resistance of the material in the shorting dots 44 is a function of the latching and holding current required to drive the surge protection device into a latched state. By modifying the impurity concentration of the semiconductor layer 130 in which the emitter region 42 is formed, the resistance of the shorting dots 44 can be tailored to achieve different latching and holding currents. The higher the resistance of the shorting dots 44, the lower the latching and holding current for the device, it being realized that the product of the two electrical parameters must result in a voltage of about 0.7 in order to forward bias the emitter region 42 into full conduction. The semiconductor layer 130 can be formed with a P-type impurity concentration less than or greater than that of the underlying epitaxial layer 40.

The top semiconductor layer 130 can also be made with a desired thickness, which also relates to the desired latching and holding current parameters of the device. Depending on the depth of the emitter region 42, the semiconductor layer 130 can be 20 microns thick, or even less. The thinner the semiconductor region, the less resistance there is in the shorting dots 44. It can be appreciated that when epitaxy processes are employed, the thickness of various semiconductor layers can be carefully controlled.

Figure 12:
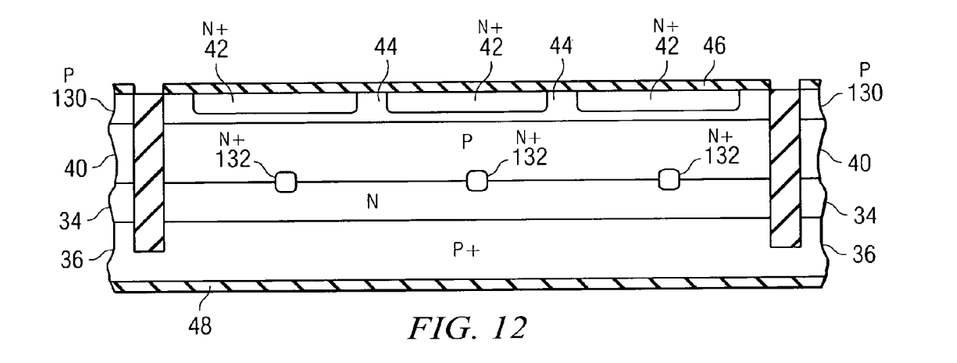
FIG. 12 is another embodiment of the invention similar to that shown in FIG. 11, but with only a single impurity type of dopant forming the buried regions.

While the surge protection device of FIG. 11, and other embodiments described herein employ buried regions with P and N regions, such type of buried region may not be necessary. Shown in FIG. 12 is a surge protection device similar to that shown in FIG. 11, but with a single doped buried region 132. Here, an N+ buried region 132 is formed in the mid-region 34. This type of buried region 132 may be effective with surge protection devices operating in higher voltage applications.

Figure 13A:
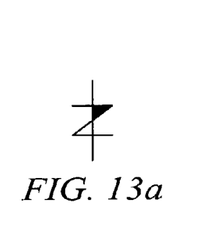
FIG. 13a is an electrical symbol of a unidirectional device according to the invention.
Figure 13B:
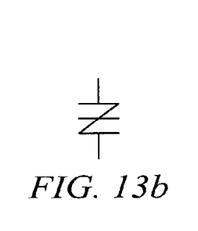
FIG. 13b is an electrical symbol of a bidirectional device according to the invention.
Figure 13C:
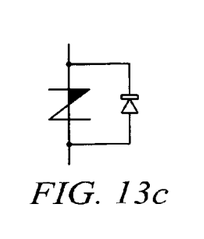
FIG. 13c is an electrical symbol of a unidirectional device of the invention with an anti-parallel diode connected in parallel therewith.

The electrical symbols of surge protection devices are not entirely standardized, and vary depending on the actual device and the manufacturer. FIG. 13a illustrates the electrical symbol for a unidirectional surge protection device, and FIG. 13b illustrates the electrical symbol for a bidirectional surge protection device. FIG. 13c illustrates the electrical symbol for a unidirectional surge protection device with an anti-parallel diode connected across the device. Often an anti-parallel diode is connected across a unidirectional device to provide surge protection in one direction through the surge protection device, and a low impedance path through the diode for opposite polarity surge voltages. Those skilled in the art will find from the foregoing description, that it would be an elementary task to incorporate antiparallel diodes into the integrated circuit.

FIGS. 14-21 illustrate another embodiment of a surge protection device during various stages of processing. A feature of this embodiment is the low overall capacitance of the surge protection device, and that the capacitance of the device is substantially independent of operating voltage, i.e., low Δ capacitance. The low capacitance exhibited by the surge protection device described below is attributable to the utilization of an intrinsic semiconductor layer and a semiconductor base layer, in which the junction therebetween provides a wide depletion layer and a corresponding low capacitance. In addition to the low capacitance characteristics, and low Δ capacitance characteristics of the surge protection device, such device can be fabricated using multiple epitaxial semiconductor processing steps, thereby allowing the buried regions to be made small in size, but heavily doped to realize low breakover voltage capabilities.

The overall capacitance of a conventional surge protection device of the semiconductor type is that contributed by the buried regions, and that contributed by the depletion region between the mid-region and the base layer. The capacitance of the buried regions is in the depletion region between the buried region itself and the mid-region, in which the buried regions are formed. These two device capacitances are in parallel, and thus additive. The capacitance attributable to the buried regions can be reduced by fabricating the buried regions as small islands, thus minimizing the respective area of the depletion regions. The minimization of the buried region capacitance is described above. The other parallel capacitance of the device can be minimized by fabricating the surge protection device according to the following techniques.

Figure 14:
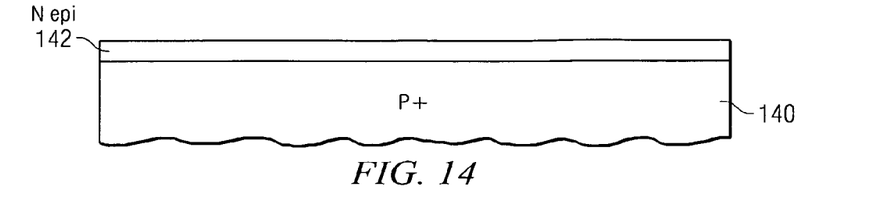
FIG. 14 is a cross-sectional view of another embodiment of a unidirectional surge protection device shown during initial fabrication thereof, after an epitaxial buffer region has been formed on the semiconductor substrate.

The surge protection device according to this embodiment of the invention is fabricated using a starting wafer of a heavily doped P-type substrate 140, as shown in FIG. 14. The doping level of the semiconductor substrate 140 can be such that the resistivity of the material is in the range of about 0.005-0.02 Ω-cm. Next, the wafer substrate 140 is placed in an epitaxial reactor to grow an N-type buffer layer 142 of semiconductor material. The buffer layer 142 of epitaxial material can be about 5 microns thick, and can be formed with a resistivity of about 0.3 Ω-cm. For low breakover voltage surge protection devices, the thickness of the buffer layer 142 can be made less, down to about one micron, or so, for six-volt devices. The function of the buffer layer 142 of epitaxial material is to prevent a depletion layer formed in the mid-region of the device from reaching the P-type substrate 140 during reverse voltage conditions.

Figure 15:
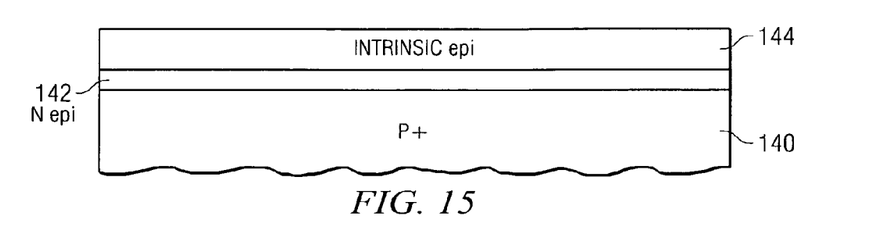
FIG. 15 is a cross-sectional view after a first part of an intrinsic epitaxial layer has been grown on the buffer layer.

The surge protection device of this embodiment includes a mid-region constructed by a two-part epitaxial process for forming an intrinsic layer of epitaxial material with conductive wells, i.e., buried regions, formed therein. Once the buffer layer 142 has been formed, the wafer can continue epitaxial processing by forming the first part of an intrinsic epitaxial layer 144 thereon, as shown in FIG. 15. The first intrinsic epitaxial layer 144 is preferably of a very high resistivity, i.e., low impurity concentration. Resistivities of the intrinsic epitaxial layer 144 between 200-400 Ω-cm are practical, but higher resistivities are better. While less preferable, intrinsic resistivities in the neighborhood of 100 Ω-cm can be utilized. To achieve higher resistivities of the intrinsic epitaxial layer 144, it may be necessary to purge the epitaxial reactor after forming the buffer layer 142 to remove the N-type background impurities from the reactor. In any event, the first part of the intrinsic epitaxial layer 144 can be formed with a thickness between about 10 to 25 microns, and preferably 15 microns, for a 350 volt surge protection device.

Figure 16:
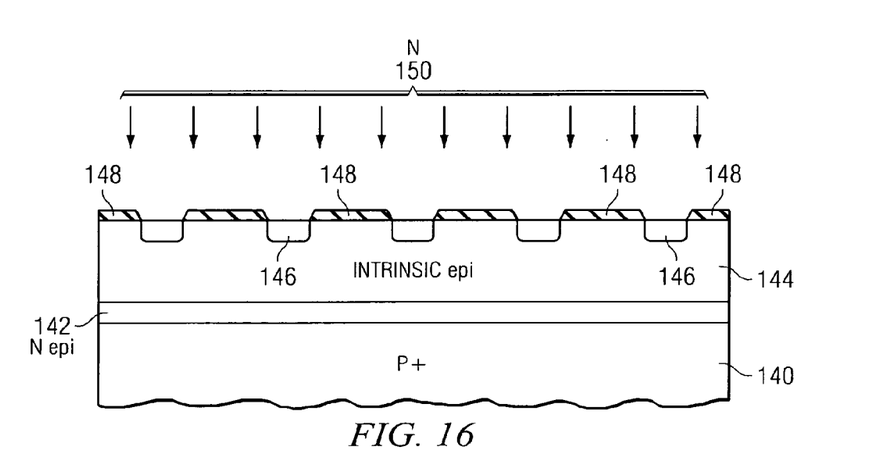
FIG. 16 is a cross-sectional view after the wafer has been masked and implanted with an impurity to form buried regions in the first part of the intrinsic epitaxial layer.

Once the first part of the intrinsic epitaxial layer 144 has been formed on the buffer layer 142, buried regions are then formed therein, as shown by reference numeral 146 in FIG. 16. One or more buried regions 146 can be formed in the surface of the first intrinsic epitaxial layer 144. The wafer is masked with a suitable oxide 148, and openings are formed therein at locations where it is desired to form the buried regions 146. Selective surface areas of the first intrinsic epitaxial layer 144 are thus exposed to the impurities used to form the buried regions 146. Preferably, the impurities are implanted (as shown by the arrows 150) into the unmasked areas of the wafer. The ion implant step is preferable, as the impurities can be embedded into the wafer at a processing temperature much less than that needed for deep diffusion of the impurities. However, the wafer could undergo a drive step in which the temperature of the wafer is elevated for a period of time to drive the impurities into the first intrinsic epitaxial layer 144, and also to anneal the device to heal any damage to the surface of the wafer due to the high energy impact of the impurity ions striking the surface of the wafer. The buried regions 146 remain small in area, and thus exhibit a correspondingly small capacitance, as long duration and high temperature impurity drives are not necessary to bury the regions 146 into the mid-region. The impurity type implanted into the first intrinsic epitaxial layer 144 is preferably N-type in the wafer shown. The particular type of impurity employed can be suitably chosen by the device designer to accomplish desired benefits. It should be appreciated that a low capacitance surge protection device can be made with opposite type impurities, as compared to those shown and described herein.

Figure 17:
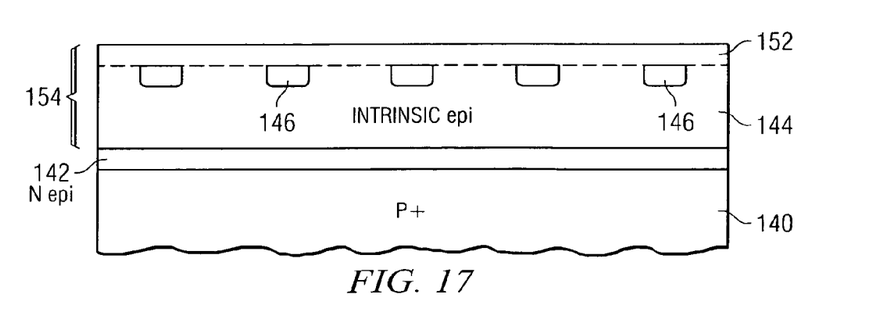
FIG. 17 is a cross-sectional view after a second part of the intrinsic epitaxial layer has been grown on the first epitaxial part, thereby burying the buried regions in the intrinsic epitaxial layer.

Once the buried regions 146 have been formed, the oxide mask 148 is removed by a suitable etchant. The buried regions 146 are then "buried" by growing a second intrinsic epitaxial layer 152 over the first intrinsic epitaxial layer 144 and over the buried regions 146. This is shown in FIG. 17. The combined first and second intrinsic epitaxial layers forming the mid-region are shown by reference numeral 154. The second intrinsic epitaxial layer 152 is preferably grown with the same high resistivity as that of the first intrinsic epitaxial layer 144, so that the intrinsic layers 144 and 152 become generally homogeneous and indistinguishable from each other. The overall thickness of the intrinsic epitaxial layers 154 affects the magnitude of the breakover voltage of the surge protection device.

Figure 18:
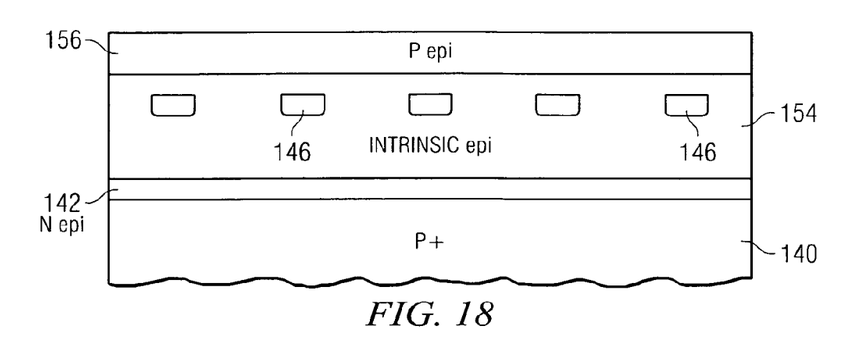
FIG. 18 is a cross-sectional view after an epitaxial base layer has been grown on the intrinsic epitaxial layer.

FIG. 18 illustrates the processing of the surge protection device to form a P-type base layer 156 on the wafer. The base layer 156 is formed with an epitaxial process by growing a P-type layer, to a thickness of about five microns. The P-type impurity concentration can be in the neighborhood of about 0.1 Ω-cm. The wafer need not be removed from the epitaxial reactor when forming the second intrinsic epitaxial layer 152 and the P-type base layer 156. Rather, the reactor need only be controlled by admitting the P-type impurity therein after the second intrinsic epitaxial layer 152 has been formed. As can be appreciated, the overall time in processing the surge protection device, as well as the temperature budget, is substantially reduced, as compared to the formation of the various semiconductor layers and regions by standard diffusion techniques well known in the art.

Figure 19:
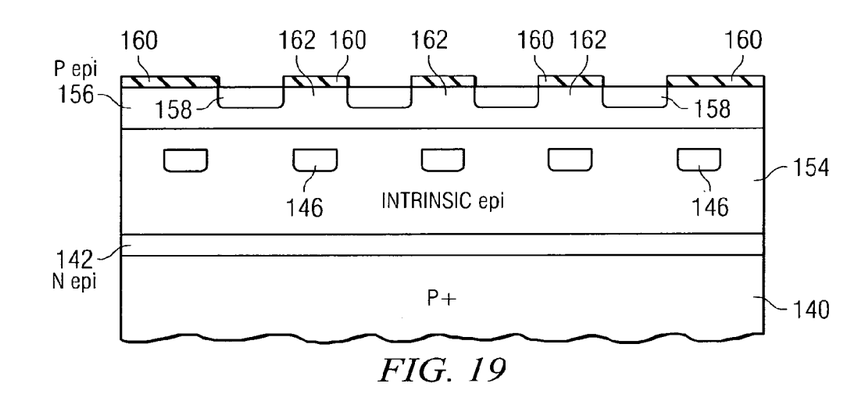
FIG. 19 is a cross-sectional view after the wafer has been masked and emitter regions have been formed in the base layer of the surge protection device.

FIG. 19 illustrates the processing steps of the surge protection device in forming the emitter 158 or cathode region of the surge protection device. The emitter region 158 is formed as a heavily doped N-type region in the P-type base layer 156. In forming the emitter region 158, the wafer is masked with a suitable oxide or other mask material, as shown by numeral 160. While not shown, the emitter region 158 is essentially a single region, with a number of non-emitter islands or areas, one shown as numeral 162. The individual non-emitter areas are well known as shorting dots 162 where the base layer 156 extends to the surface of the wafer. As will be described below, the metal emitter contact makes contact with both the shorting dots 162 and the emitter region 158. As is well known in the art, the number, placement and surface area of the shorting dots relate to the switching current ($I_S$) and holding current ($I_h$) of the device. In any event, the emitter 158 is formed by diffusing N-type impurities into the unmasked areas of the base layer 156. The emitter 158 is heavily doped to an N+ concentration. This diffusion step is the only high temperature process that is carried out on the surge protection device for a long period of time. The minimal exposure of the surge protection device to high temperature processing maintains the buried region junction concentrations substantially the same as when formed, and substantially the same size, thus eliminating a number of variables to consider when defining the breakover voltage and other parameters of the device.

Figure 20:
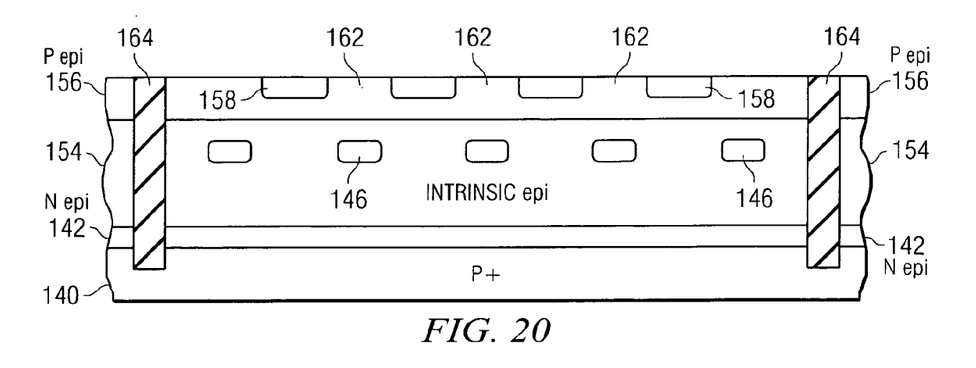
FIG. 20 is a cross-sectional view after the wafer has undergone processing to form trenches filled with an oxide isolation.

The emitter mask 160 is removed, and the wafer is processed to reduce the thickness of the P+ substrate 140. A thick substrate 140 is desired during wafer processing to provide physical strength to the wafer and minimize breakage. However, a thick substrate 140 is undesirable in a device in which current flows between opposite faces of the substrate, as the extra substrate material only contributes series resistance to the device. Accordingly, the wafer undergoes a backgrind process in which the P+ substrate 140 is lapped to reduce the thickness thereof, the result of which is shown in FIG. 20.

The top of the wafer is then processed to form a lattice of trenches therein by suitable mask and etching techniques. The trench lattice is then filled with an oxide 164, such as a glass-type oxide to provide junction isolation to the side edges of each chip of the wafer. The oxide-filled trenches 164 extend down into the P+ substrate 140 a sufficient distance to assure that reverse breakdown does not occur under such trenches 164. With the isolation trenches 164 formed deep into the substrate 140, large amplitude voltages of either polarity can be supported.

Figure 21:
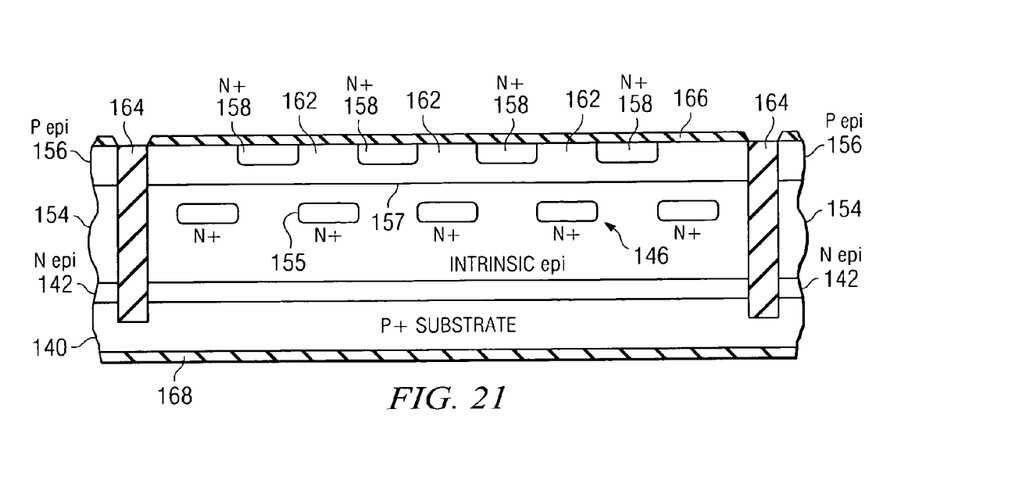
FIG. 21 is a cross-sectional view after the wafer has been processed to form top and bottom metal contacts.

Metal contacts are then deposited on the surge protection device. As shown in FIG. 21, an emitter or cathode contact 166 is formed on the top of the wafer. The emitter contact 166 is effective to short circuit the emitter region 158 to the shorting dot 162 portion of the base layer 156. The emitter contact 166 is formed in a conventional manner by the evaporation of aluminum on the top surface of the wafer. In like manner, the backside of the wafer, namely, the exposed bottom surface of the P+ substrate 140 is processed to form an anode aluminum contact 168 thereon. The surge protection device can then be further processed to separate the wafer into individual chips, and encapsulate the chips into the desired two-terminal package.

The surge protection device shown in FIG. 21 is characterized by a capacitance of the junction 155 between the N+ buried regions 146 and the intrinsic epitaxial layer 154. As can be appreciated, the fewer the number of buried regions 146, the lower the capacitance, but the lower the initial current carrying capability of the device. Also, the higher the impurity concentration of the buried regions 146, the higher the capacitance, but the lower the breakover voltage of the device.

The other major capacitance of the surge protection device of FIG. 21 is the capacitance of the junction 157 between the P-type base layer 156 and the intrinsic epitaxial layer 154. It is this latter capacitance that is minimized by the utilization of the intrinsic epitaxial layer 154 that forms the mid-region of the device. As is well known, the capacitance of a semiconductor junction is a function of the width of the depletion layer, in addition to other parameters. The wider the depletion layer, the lower the capacitance. The width of the depletion layer is electrically similar to the space between the plates of a discrete capacitor.

The overall capacitance of the surge protection device should be minimized in order to reduce the capacitive loading to the communication line (or other conductor) to which the device is connected. With less capacitance, the surge protection device can be connected to high speed digital and other communication lines without adversely affecting the data transmission speed, the error rate, and other parameters. As noted above, it is equally important that the surge protection device present a relatively constant Δ capacitance to the communication line to minimize the change in electrical characteristics of the line as a function of the normal voltages applied to the line. When the communication line experiences an overvoltage, the surge protection device enters into avalanche breakdown and the four-layer device presents a low impedance to the line, thereby protecting downline circuits from the overvoltage.

Figure 22:
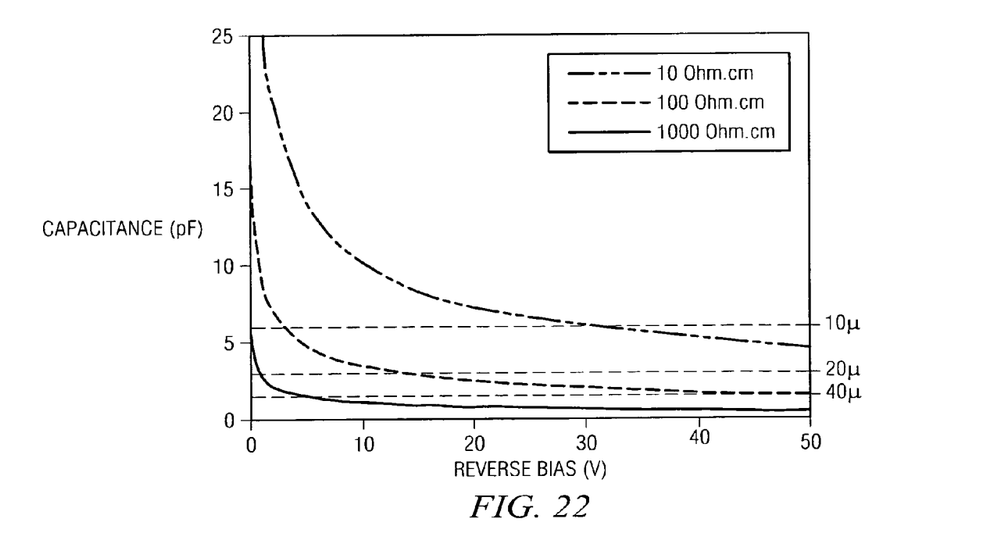
FIG. 22 graphically depicts the electrical characteristics of a semiconductor device employing intrinsic semiconductor material, which exhibits low overall capacitance, and that the change in capacitance is extremely small as a function of voltage applied across the device.

FIG. 22 illustrates the capacitive characteristics of a three-layer device having a P-type layer of semiconductor material separated from an N-type layer of semiconductor material by an intrinsic layer of material. The capacitance is shown as a function of different resistivities and thicknesses of the intrinsic epitaxial layer. The capacitive characteristics are representative of a device having a size of thirty square mils square. As can be seen, as the resistivity of the intrinsic semiconductor layer increases (the concentration of impurities is reduced), the capacitance of the device is reduced. In addition, as the resistivity of the intrinsic semiconductor layer increases, the change in capacitance (Δ capacitance) as a function of reverse voltage across the device is reduced. For example, for a reverse voltage across the device of about forty volts, the device capacitance is about 6 pf with an intrinsic layer resistivity of 10 Ω-cm, whereas at a resistivity of 1000 Ω-cm, the device capacitance is about 2 pf. In addition, the device capacitance with an intrinsic layer resistivity of 1000 Ω-cm is relatively constant in the voltage range of 5-50 volts, and above. As also seen in FIG. 22, the capacitance of the device is reduced as the thicknesses of the intrinsic semiconductor layer is increased. With a thicker intrinsic semiconductor layer, the depletion region formed by the PN junction can be wider.

A charged capacitor, whether it be of the semiconductor type or a discrete type, has the same charge on both plates thereof, albeit of opposite polarity. Thus, when the junction 157 (FIG. 21) between the P-type base layer 156 and the intrinsic semiconductor layer 154 is charged, equal charge is accumulated on both plates. The depletion region extends a short distance into the P-type base region because it is more heavily doped, as compared to the depth of the depletion region in the intrinsic semiconductor region 154. This is because more charge is available in the P-type base region 156. On the other hand, the depletion region extends well into the intrinsic semiconductor region 154, as much less charge is available to counterbalance the opposite-polarity charge on the other capacitor plate, defined by the P-type base layer 156. Indeed, for large reverse voltages across the surge protection device, the depletion region can extend a substantial distance into the intrinsic semiconductor region 154, and even through the intrinsic region 154, depending on the thickness thereof and magnitude of the reverse voltage. In order to prevent the depletion region from extending through the intrinsic semiconductor region 154 and into the substrate 140, thereby short circuiting the device, the N-type buffer layer 142 prevents substantial spread of the depletion region therein. With a substantial amount of charge available in the buffer layer 142, the charge equalization of the semiconductor capacitor can be accomplished, even with high reverse voltages and thin intrinsic layers 154, without extending through the buffer layer 142. The buffer layer 142 thus effectively functions as a depletion layer stop. With low voltage operation, and/or thick intrinsic layers 154, the buffer layer 142 could be omitted.

The surge protection device shown in FIG. 21 is a four-layer device triggered into conduction by a regenerative effect. The NPN transistor of such a structure includes the N-type cathode 158, the P-type base 156, and the intrinsic layer 145 and N-type buffer layer 142. The PNP transistor of the surge protection device includes the P-type base 156, the intrinsic layer 154 and the N-type buffer layer 142, and the P-type substrate 140. This structure is forward biased when the anode contact 168 is biased positive with respect to the cathode contact 166. In this biased state, in order for the device to be driven into conduction, the junction between the intrinsic semiconductor layer 154 and the base layer 156 must be forward biased. In a reverse bias state when the cathode contact 166 is biased positive with respect to the anode contact 168, the junction that blocks current flow is the junction between the P-type substrate 140 and the N-type buffer layer 142.

Figure 23:
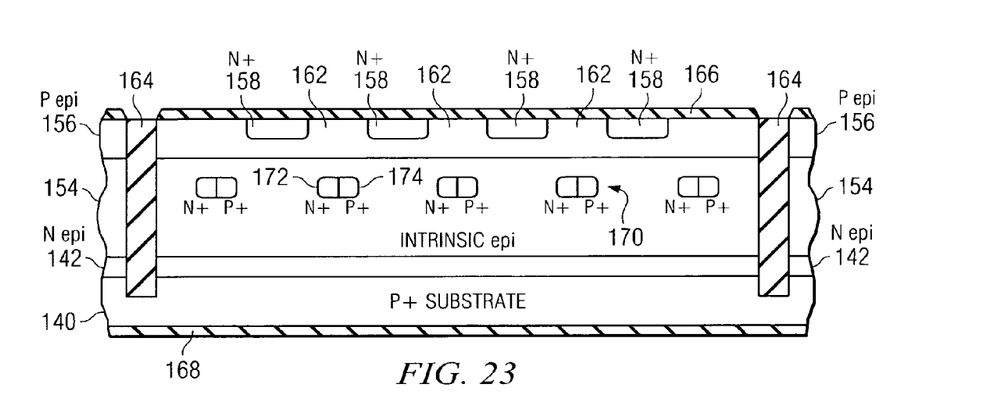
FIG. 23 is a cross-sectional view of another embodiment of a surge protection device, similar to that shown in FIG. 21, but with PN buried regions.

FIG. 23 illustrates another embodiment of the surge protection device embodying intrinsic epitaxial material in the mid-section 154 of the device. Here, the buried regions 170 could be regions comprised of an N+ region 172 forming a junction with a P+ region 174. These PN buried regions 170 can be formed in the same manner described above.

Figure 24:
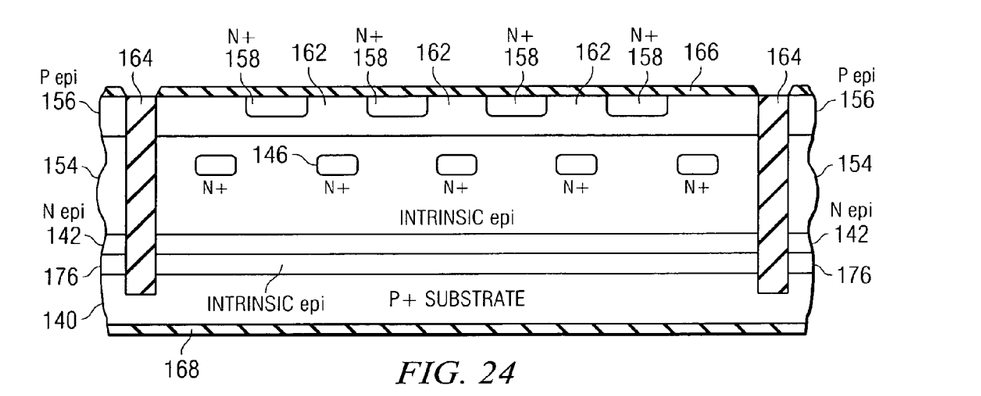
FIG. 24 is a cross-sectional view of another embodiment of a surge protection device, with bidirectional blocking capabilities.

FIG. 24 is another embodiment of the invention that is well adapted for reverse blocking. Except for the additional intrinsic layer 176 of semiconductor material, the structure can be fabricated in the same manner described above in connection with FIGS. 14-22. In the fabrication of the surge protection device of FIG. 24, the P+ substrate 140 is placed in an epitaxial reactor and the layer 176 of intrinsic epitaxial material is grown. For a 350-volt breakdown device, the intrinsic layer 176 can be about 20 micron thick. Again, it is desirable that the intrinsic layer 176 be as highly resistive as practical. During the same epitaxial reactor processing, the N-type buffer layer 142 can be grown on top of the intrinsic epitaxial layer 176. The reactor need only be controlled so as to admit an N-type impurity into the reactor after the intrinsic layer 176 has been completed. The remainder of the surge protection device can be fabricated in the same manner described above.

Various embodiments of a surge protection device embodying the principles and concepts of the invention have been disclosed. It should be understood that the different features of each of the embodiments can be employed together, or separately to achieve the desired results. Indeed, the various features disclosed above can be selected and used together to combine the various features desired in a surge protection device. Additionally, while the various embodiments are described with the semiconductor regions fabricated with a certain type of impurity, the devices can be fabricated using the opposite type impurities for the semiconductor regions. The various features have been described in connection with a two-terminal thyristor. However, the features can be employed in other semiconductor devices, including SCR's, triacs, and other two and three terminal device. While the various embodiments of the invention employ shorting dots in the emitter, there may be other applications or other situations where shorting dots are not necessary.

While the preferred and other embodiments of the invention have been disclosed with reference to specific semiconductor structures, it is to be understood that many changes in detail may be made as a matter of engineering choices without departing from the spirit and scope of the invention, as defined by the appended claims.

What is claimed is:

1. A surge protection device of the type having a four-layer semiconductor chip, one or more buried regions and at least two terminals, where conduction occurs from one face of said chip to an opposite face of said chip when a voltage exceeding a breakover voltage is applied to the device, the device comprising:

one or more buried regions formed in a surface of a semiconductor layer of said device, an impurity concentration of said buried regions defining in part the breakover voltage of said surge protection device, wherein each said buried region comprises two semiconductor regions joined by a PN junction; and an epitaxial layer of semiconductor material formed over said semiconductor layer so as to cover said buried regions, whereby a processing of said epitaxial layer does not substantially change a size of said buried regions, thus controlling a capacitance of said device.

2. The surge protection device of claim 1, wherein said epitaxial layer defines a first epitaxial layer, and further including a second epitaxial layer of semiconductor material formed on said first epitaxial layer, said first and second epitaxial layers of opposite type impurities.

3. The surge protection device of claim 2, further including one or more emitters formed in said second epitaxial layer of semiconductor material.

4. The surge protection device of claim 1, wherein the PN junction of each buried region is generally orthogonal to an interface between said semiconductor layer and said epitaxial layer.

5. The surge protection device of claim 4, wherein one semiconductor region of said two semiconductor regions laterally surrounds the other semiconductor region of said two semiconductor regions.

6. The surge protection device of claim 1, wherein said buried region comprises a criss-crossed pattern.

7. The surge protection device of claim 1, wherein said surge protection device is a unidirectional device for carrying current resulting from a surge voltage in one direction through said surge protection device.

8. The surge protection device of claim 1, wherein said surge protection device is a bidirectional device for carrying current resulting from a surge voltage in opposite directions through said surge protection device as a function of a polarity of the surge voltage.

* * * * *